(12) United States Patent
Kofler et al.

(10) Patent No.: US 9,407,258 B1
(45) Date of Patent: Aug. 2, 2016

(54) EFFICIENT DRIVER CIRCUIT

(71) Applicant: NXP B.V., Eindhoven (NL)

(72) Inventors: Robert Kofler, Gratkorn (AT); Hermanus Effing, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/806,454

(22) Filed: Jul. 22, 2015

(51) Int. Cl.
*H03K 17/687* (2006.01)
*H03K 17/567* (2006.01)

(52) U.S. Cl.
CPC ............ *H03K 17/687* (2013.01); *H03K 17/567* (2013.01)

(58) Field of Classification Search
CPC ................... H03K 19/00361; H03K 17/9502; H03K 17/954; H03K 17/9542; H02M 1/38; H02M 7/44; H02M 1/08; H02M 3/1588; H02M 3/158; H02M 3/1582; H03F 3/191; H03F 3/21; H03F 3/16
USPC .......... 327/108, 109, 111, 112, 164, 165, 168
See application file for complete search history.

(56) References Cited

U.S. PATENT DOCUMENTS

| 5,969,554 A | 10/1999 | Chan et al. | |
|---|---|---|---|
| 7,928,713 B2 * | 4/2011 | Nguyen | G05F 1/56 323/282 |

OTHER PUBLICATIONS

Wall, R.W. "Simple methods for detecting zero crossing", Proceedings of the 29th Annual Conference of the IEEE Industrial Electronics Society, 1-5 pgs. (2012).

* cited by examiner

*Primary Examiner* — John Poos
(74) *Attorney, Agent, or Firm* — Rajeev Madnawat

(57) ABSTRACT

A driver circuit for driving a resonance circuit is disclosed. The driver circuit includes an input to receive an input signal, an amplifier to amplify the input signal, a pulse generator to generate a pulse train based on a modulation signal, a switch coupled to the pulse generator, a capacitor coupled to the switch in parallel such that when the switch is on, the capacitor is bypassed and a Resistor-Inductor-Capacitor (RLC) tank circuit coupled to the switch and the capacitor such that the capacitor is connected in series to capacitance of the RLC tank circuit.

18 Claims, 4 Drawing Sheets

EFFICIENT DRIVER CIRCUIT

BACKGROUND

Phase-shift keying (PSK) is a digital modulation scheme that conveys data by changing, or modulating, the phase of a carrier wave. PSK uses a finite number of phases, each assigned a unique pattern of binary digits. Usually, each phase encodes an equal number of bits. Each pattern of bits forms the symbol that is represented by the particular phase. A demodulator, which is designed specifically for the symbol-set used by a modulator, determines the phase of the received signal and maps it back to the symbol it represents, thus recovering the original data.

Binary Phase-shift Keying (BPSK) is a form of PSK. BPSK uses two phases which are typically separated by 180°. This modulation is more robust of all the PSKs since it takes the highest level of noise or distortion to make the demodulator reach an incorrect decision. It is, however, only able to modulate at 1 bit/symbol. In simple terms, changes from 0 to 1 or 1 to 0 encompasses switching the phase of the carrier signal between 0° and 180°.

In many applications such as passive keyless entry (PKE) or immobilizer systems, low frequency (LF) drivers are used to drive current into LF antennas to create electromagnetic field that can be received by a car key fob. Amplitude Shift Keying (ASK) modulation is typically used in these applications. In some applications, Binary Phase Shift Keying (BPSK) modulation is also used to allow enhanced data rate and shorter authentication periods.

Antennas circuits that process BPSK signals typically exhibit low power and operational efficiencies due to the presence of capacitance in those circuits, especially when the Q-factor is large. At every phase shift, capacitors in the processing circuits may need to be discharged and then charged again. When a capacitor is discharged, the energy stored therein is wasted thus the circuit consumes more power and may require enhanced cooling mechanism.

Typically a carrier signal is modulated using a digital modulator signal. A phase change in the output signal occurs when the polarity of the modulator signal changes. FIG. 1 illustrates the wave shape during a 180° phase change. The shape or valley 50 represents the discharging and charging of antenna capacitance. The width of the valley 50 may depends on the Q factor of the capacitance. The higher the Q factor, the wider the valley 50 because it takes more time until the phase of the antenna current settles to the new value during modulation. As a result, the signal quality and power efficiency decrease.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a driver circuit for driving a resonance circuit is disclosed. The driver circuit includes an input to receive an input signal, an amplifier to amplify the input signal, a pulse generator to generate a pulse train, a switch coupled to the pulse generator, a capacitor coupled to the switch in parallel such that when the switch is on, the capacitor is bypassed and a Resistor-Inductor-Capacitor (RLC) tank circuit coupled to the switch and the capacitor such that the capacitor is connected in series to capacitance of the RLC tank circuit.

In some embodiments, the pulse generator includes an input to receive a modulator signal. The pulse generator may also include a zero crossing detection circuit that is configured to output a pulse at each state change of the modulator signal. A duty cycle of the pulse train is configured based on a frequency of the input signal. The driver circuit may also include a predriver circuit coupled to the amplifier such that the input signal first passes through the predriver prior to been inputted to the amplifier. The predriver includes a first output and a second output. The amplifier includes a first transistor and a second transistor wherein the first output is coupled to the first transistor and the second output is coupled to the second transistor.

In another embodiment, a driver circuit to drive a Resistor-Inductor-Capacitor (RLC) tank circuit is disclosed. The driver circuit includes an input to receive a carrier wave to cause resonance in the RLC tank circuit, a pulse generator to generate a pulse train based on a modulation signal, a switch coupled to the pulse generator and a capacitor coupled to the switch in parallel such that when the switch is on, the capacitor is bypassed. The switch is configured to be operated by the pulse train such that turning on the switch electrically disconnects the capacitor from the RLC tank circuit for the duration of a pulse width of the pulse train. The carrier wave is used to cause resonance in the RLC tank circuit.

In some embodiments the pulse generator includes a zero crossing detection circuit that is configured to output a pulse at each state change of the modulation signal. The pulse generator is configured to produce a pulse with a duty cycle based on a frequency of the carrier wave. A value of the capacitor is calculated based on a desired phase shift to be introduced in parts of the carrier wave. The driver circuit may further include an amplifier circuit to amplify the carrier wave. The amplifier includes a predriver circuit. The predriver circuit includes a first output and a second output. The amplifier includes a first transistor and a second transistor. The first output is coupled to the first transistor and the second output is coupled to the second transistor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

DETAILED DESCRIPTION

Figure 2:
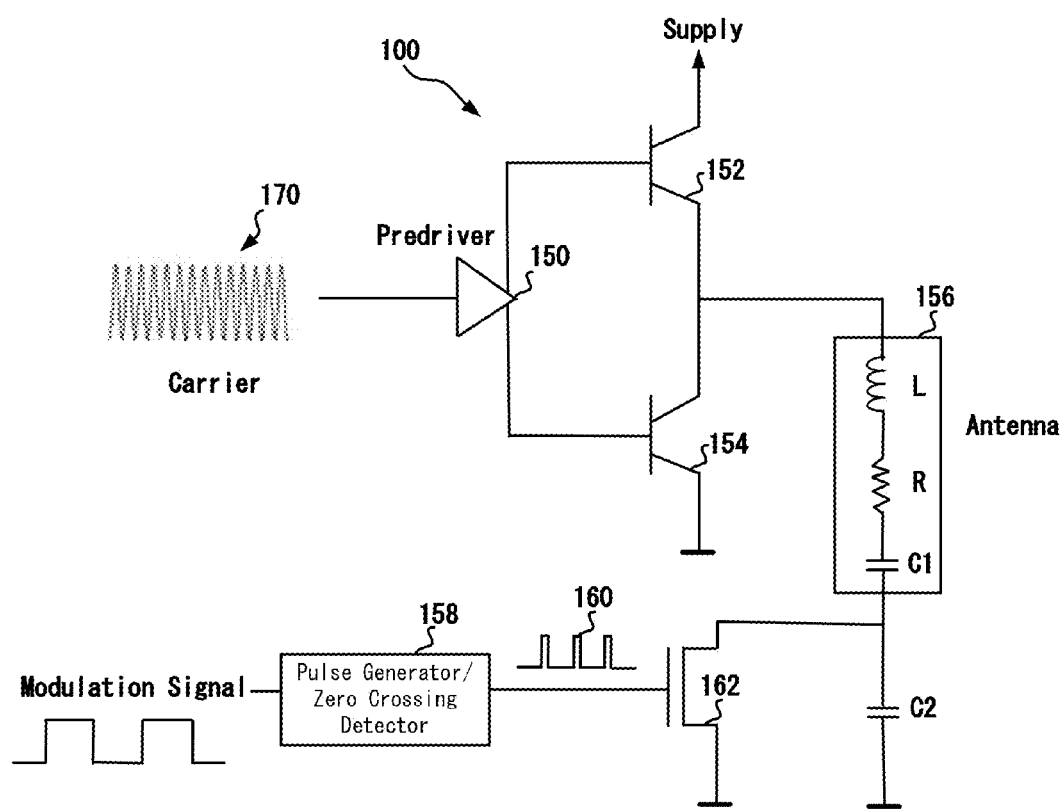
FIG. 2 is a driver circuit in accordance with one embodiment of the present disclosure.

FIG. 2 illustrates a driver circuit 100 for an antenna 156. The antenna 156 has resistance (R), capacitance (C) and inductance (L) either inherently or discrete R, L, C components are included in the antenna 156. Hence, R denotes total resistance of the antenna 156, L denotes total inductance of the antenna 156 and C denotes total capacitance of the antenna 156. In response to a periodic signal applied to the antenna 156, L emits an electro-magnetic (EM) signal. It should be noted that even though FIG. 2 is explained using a specific example, a person skilled in the art would appreciate that the embodiments described herein may also be used in other types of circuits that process signals with phase shifts.

The driver circuit may include a predriver 150. In one embodiment, the predriver 150 accepts an input signal including a carrier wave and provides two outputs to drive transistors 152 and 154. The transistors 152 and 154 provides power amplification to the input signal. In some embodiments, the power amplification portion may include other electronic components. However, so as not to obfuscate the present disclosure, those components have been omitted.

The predriver 150 may perform voltage level shifting and produce two outputs to drive the transistors 152, 154. The predriver 150 is configured to accept an input signal having a first voltage range and to produce an output signal having a second voltage range.

As shows, the predriver 150 includes two outputs, each having a different voltage output range. Each of these outputs are coupled to different amplifier transistors 152, 154. The voltages provided to these transistors 152, 154 depends on transistor types (e.g. n-channel or p-channel) and the circuit topology (e.g. complementary, quasi-complementary etc.).

The driver circuit 100 further includes a pulse generator 158. The pulse generator 158 includes a zero crossing detector circuit (not shown). Zero crossing detection is a common method for measuring the frequency or the period of a periodic signal. When measuring the frequency of a signal, usually the number of cycles of a reference signal is measured over one or more time periods of the signal being measured. In case of an alternating current signal, for each cycle, a zero crossing detector will output two pulses, one for each time the signal cross over the zero voltage line.

The pulse generator 158 outputs a high signal when the modulated input signal crosses over from positive to negative side or vice versa. It should be noted that the modulated signal includes the information to be transmitted via the antenna 156. A person skilled in the art will appreciate that the pulse generator 158 may output a pulse train having a low signal pulses instead of the high signal pulses depending upon a particular application and/or the type of switch 162 (e.g., NMOS, PMOS, N-type, P-type, etc.). The career frequency of the input signal 170 depends on an application. For example, in an auto keys, the carrier frequency may be in 100 KHz range and the modulator signal may have a frequency in 1-20 kbit/sec range. It should be noted that these values are for example purposes only. The driver circuit 100 described herein is not bound to work with a particular frequency range only. The pulse generator 158 generates a pulse train 160 having a duty cycle such that the pulse train 160 turns on the switch 162 for one half of the period of the carrier frequency of the input signal 170. The driver circuit 100 includes a capacitor C2. When the switch 162 is off, the capacitance of the antenna 156 becomes C1+C2. This increase in the capacitance decreases the resonance frequency of the Resistor-Inductor-Capacitor (RLC) tank circuit of the antenna 156. The value of the capacitor C2 is calculated such that the frequency of the RLC tank circuit of the antenna 156 doubles when the switch 162 is on. Generally speaking, the following formula may be used to calculate the value of C2.

$$f = \frac{1}{2 \cdot \pi \cdot \sqrt{L \cdot C}}$$

When the switch 162 is off, the capacitor C2 is added to the RLC tank circuit of the antenna 156 leading to higher overall capacitance of the RLC tank circuit of the antenna 156. Consequently, the resonance frequency of the RLC tank circuit of the antenna 156 decreases. Since no forced dissipation of energy stored in capacitors is needed, the driver circuit 100 provides high efficiency and clean spectrum because the frequency change in the RLC tank circuit only affects the second harmonic while no other additional spurs arise.

It should be noted that in some embodiments the value of C2 may also depends on a desired phase shift in parts of the signal to be transmitted by the antenna 156. Additionally, in some embodiments, the frequency and/or duty cycle of the pulse train 160 may also be used to achieve a desired phase shift.

When the power amplifier that include transistors 152, 154 starts to drive the antenna 156 with an inverted phase, energy stored in the resonance circuit including R, L, C has to be dissipated before the phase transition can occur. After the phase change, the previously dissipated energy has to be replenished. These energy transition cycles are visible as residual amplitude modulation. This amplitude variable is a waste of energy as the information detected by any receiver is defined in the phase and not in amplitude. Because the existence of reactive components (e.g., L, C), the Voltage and Current may not reach the same amplitude peaks at the same time, they generally have a difference in timing. This timing difference is called "Phase Shift" and is measured in angular degrees. The driver circuit 100 provides phase shift through adding and removing capacitance in an antenna circuit.

It may be noted that in some embodiments the predriver 150 and the transistors 152, 154 or broadly speaking, an amplifier to amplify the input signal or carrier wave 170 may not be required. In such embodiments, the carrier wave 170 may be inputted to the antenna 156 where in the switch 162 in conjunction with the pulse generator 158 and the capacitor C2 provides necessary phase shift in the signal that is transmitted by the antenna 156 depending upon the modulation signal that is inputted to the pulse generator 158.

A value of the capacitor C2 depends on the frequency of the carrier wave. Typically, for a particular application, the values of carrier wave frequency and the capacitor are pre-decided during the application design process. Similarly the duty cycle of the pulse train 160 is also pre-calculated during the design time. However, in some other embodiments, the pulse generator may receive the carrier frequency input and may be configured to produce the pulse train 160 with a duty cycle dynamically based on the input carrier wave. Similarly, a control circuit (not shown) may be used in conjunction with a variable capacitor in place of a fixed value capacitor C2 to alter the capacitance of the capacitor C2 based on the carrier frequency and/or a desired phase shift. In some embodiments, C2 may be connected in parallel to C1. In such embodiments, the switch 162, C2 and R are coupled in series whereas C1 is coupled to R and the ground in parallel to C2 and the switch 162.

Figure 1:
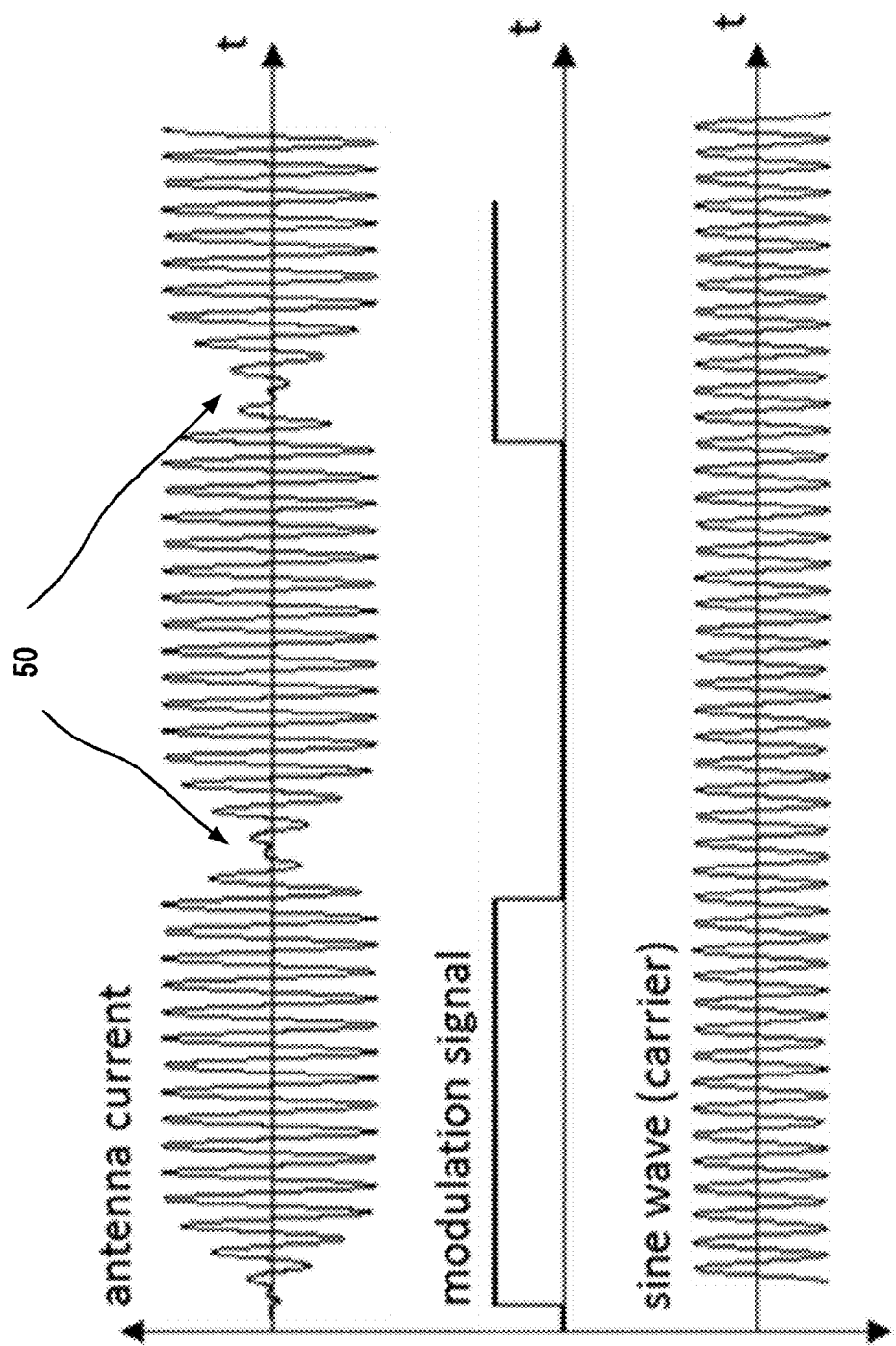
FIG. 1 shows an illustration of antenna current in a typical Binary Phase Shift Key modulation.
Figure 3:
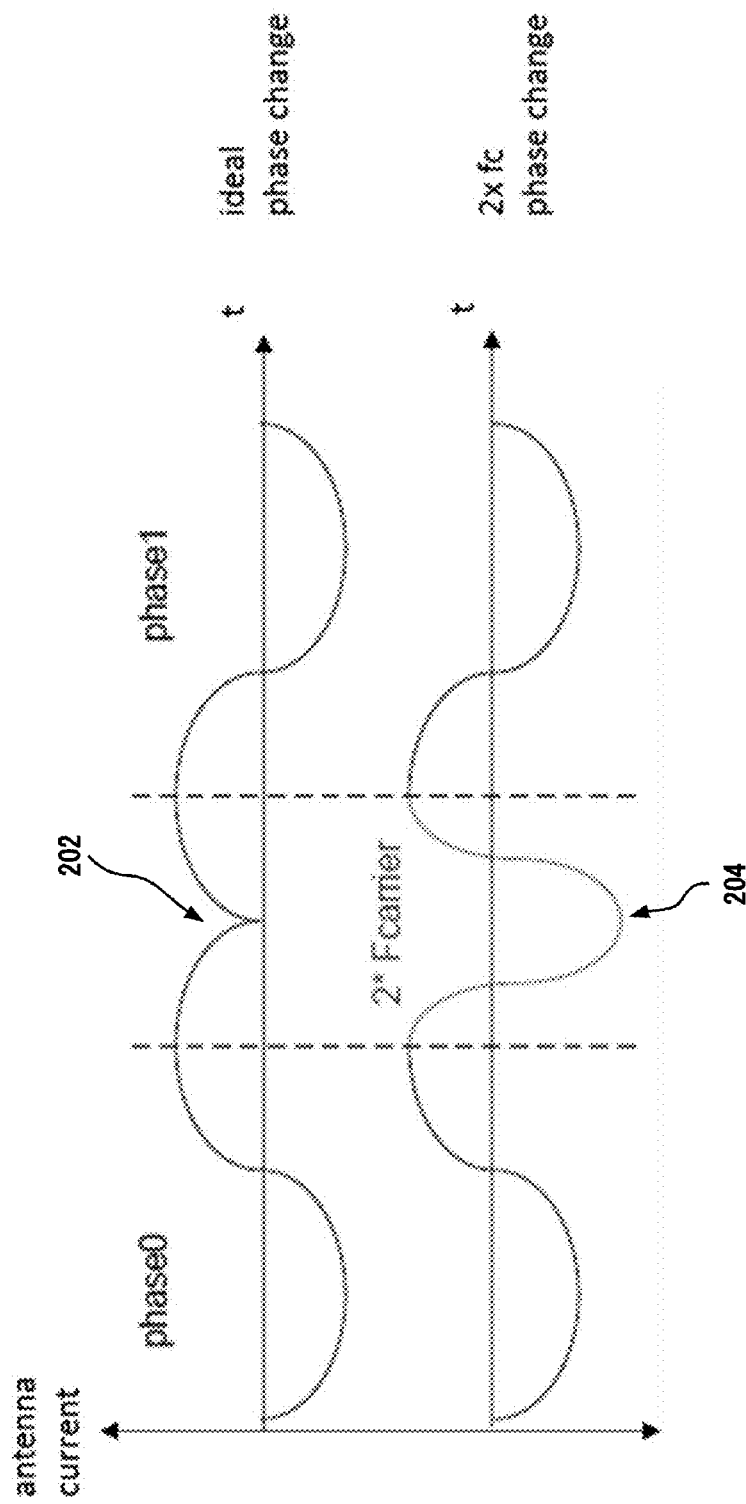
FIG. 3 illustrates a wave shape at a 180° phase change in accordance to one of more embodiments of the present disclosure.
Figure 4:
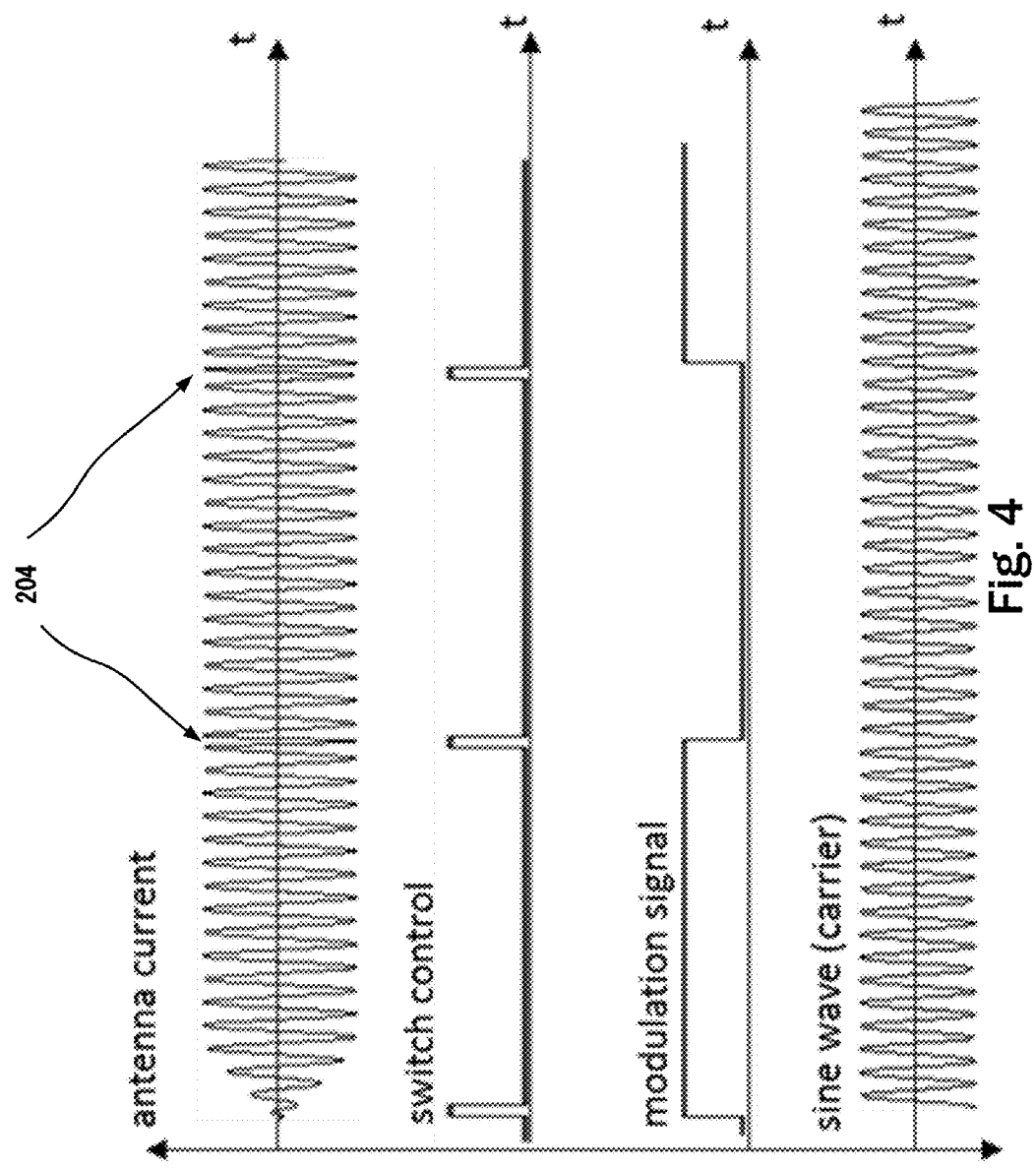
FIG. 4 illustrates a typical output of the driver circuit of FIG. 2 in accordance with an embodiment of the present disclosure.

FIG. 3 illustrates a sample antenna current waveform showing an ideal phase change from one cycle to another cycle of different phase. Hypothetically speaking, if a capacitor could charge and discharge in 0 second, the phase transformation 202 can be achieved. But since it is practically impossible to dissipate energy or charge in 0 second, the valley 50 shown in FIG. 1 results. The driver circuit 100, however, uses changing resonance frequency for a specific period during the carrier wave cycle to effect a phase change without requiring charging/discharging of capacitor(s), a phase change shape 204 between a first phase and a second phase results. As shows in FIG. 4, the phase change shape 204 provides a close to ideal phase change graph that results in a clean spectrum as compared to the antenna current waveform depicted in FIG. 1. The duty cycle of the pulse train 160 can be adjusted to further refine the phase change shape 204.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A driver circuit, comprising:
   an input to receive an input signal;
   an amplifier to amplify the input signal;
   a pulse generator to generate a pulse train, wherein the pulse generator includes a zero crossing detection circuit that is configured to output a pulse at each state change of the modulation signal;
   a switch coupled to the pulse generator;
   a capacitor coupled to the switch in parallel such that when the switch is on, the capacitor is bypassed; and
   a Resistor-Inductor-Capacitor (RLC) tank circuit coupled to the switch and the capacitor such that the capacitor is connected in series to capacitance of the RLC tank circuit.

2. The driver circuit of claim 1, wherein the pulse generator includes an input to receive a modulation signal.

3. The driver circuit of claim 1, wherein a duty cycle of the pulse train is configured based on a frequency of the input signal.

4. The driver circuit of claim 1, further including a predriver circuit coupled to the amplifier such that the input signal first passes through the predriver prior to been inputted to the amplifier.

5. The driver circuit of claim 4, wherein the predriver includes a first output and a second output.

6. The driver circuit of claim 5, wherein the amplifier includes a first transistor and a second transistor wherein the first output is coupled to the first transistor and the second output is coupled to the second transistor.

7. A driver circuit to drive a Resistor-Inductor-Capacitor (RLC) tank circuit, comprising:
   an input to receive a carrier wave to cause resonance in the RLC tank circuit;
   a pulse generator to generate a pulse train based on a modulation signal;
   a switch coupled to the pulse generator; and
   a capacitor coupled to the switch in parallel such that when the switch is on, the capacitor is bypassed, wherein the switch is configured to be operated by the pulse train such that turning on the switch electrically disconnects the capacitor from the RLC tank circuit for the duration of a pulse width of the pulse train, wherein a value of the capacitor depends on the frequency of the carrier wave.

8. The driver circuit of claim 7, wherein the carrier wave is used to cause resonance in the RLC tank circuit.

9. The driver circuit of claim 7, wherein the pulse generator includes a zero crossing detection circuit that is configured to output a pulse at each state change of the modulation signal.

10. The driver circuit of claim 7, wherein the pulse generator is configured to produce a pulse with a duty cycle based on a frequency of the carrier wave.

11. The driver circuit of claim 7, wherein a value of the capacitor is calculated based on a desired phase shift to be introduced in parts of the carrier wave.

12. The driver circuit of claim 7, further includes an amplifier circuit to amplify the carrier wave.

13. The driver circuit of claim 12, wherein the amplifier includes a predriver circuit, the predriver circuit includes a first output and a second output, wherein the amplifier includes a first transistor and a second transistor, wherein the first output is coupled to the first transistor and the second output is coupled to the second transistor.

14. A driver circuit, comprising:
   an input to receive an input signal;
   an amplifier to amplify the input signal;
   a pulse generator to generate a pulse train;
   a switch coupled to the pulse generator;
   a capacitor coupled to the switch in parallel such that when the switch is on, the capacitor is bypassed;
   a Resistor-Inductor-Capacitor (RLC) tank circuit coupled to the switch and the capacitor such that the capacitor is connected in series to capacitance of the RLC tank circuit; and a predriver circuit coupled to the amplifier such that the input signal first passes through the predriver prior to been inputted to the amplifier.

15. The driver circuit of claim 14, wherein the pulse generator includes an input to receive a modulation signal.

16. The driver circuit of claim 15, wherein the pulse generator includes a zero crossing detection circuit that is configured to output a pulse at each state change of the modulation signal.

17. The driver circuit of claim 14, wherein a duty cycle of the pulse train is configured based on a frequency of the input signal.

18. The driver circuit of claim 14, wherein the predriver includes a first output and a second output.

* * * * *